(12) United States Patent
Chou (10) Patent No.: US 9,812,198 B1
(45) Date of Patent: Nov. 7, 2017

(54) FAST SENSE AMPLIFIER WITH BIT-LINE PRE-CHARGING

(71) Applicant: TAIWAN SEMICONDUCTOR MANUFACTURING CO., LTD., Hsin-Chu (TW)

(72) Inventor: Chung-Cheng Chou, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/416,191

(22) Filed: Jan. 26, 2017

Related U.S. Application Data (63) Continuation of application No. 15/150,478, filed on May 10, 2016, now Pat. No. 9,576,653.

(51) Int. Cl.
*G11C 11/00* (2006.01)
*G11C 13/00* (2006.01)

(52) U.S. Cl.
CPC ........ *G11C 13/004* (2013.01); *G11C 13/0061* (2013.01); *G11C 13/0069* (2013.01); *G11C 2013/0042* (2013.01)

(58) Field of Classification Search
CPC ..................................................... G11C 11/00
USPC ........................................................ 365/148
See application file for complete search history.

(56) References Cited

U.S. PATENT DOCUMENTS

| | | | |
|---|---|---|---|
| 8,593,854 B1 | 11/2013 | Chih et al. | |
| 8,869,436 B2 | 10/2014 | Tsai et al. | |
| 9,019,743 B2 | 4/2015 | Tsai et al. | |
| 9,023,699 B2 | 5/2015 | Chang et al. | |
| 9,053,781 B2 | 6/2015 | Tsai et al. | |
| 9,076,522 B2 | 7/2015 | You et al. | |
| 9,153,343 B2 | 10/2015 | Chu et al. | |
| 9,196,360 B2 | 11/2015 | Chou et al. | |
| 9,224,470 B1 | 12/2015 | Chiu et al. | |
| 2006/0092689 A1* | 5/2006 | Braun ................... | G11C 7/067 365/158 |
| 2013/0234094 A1 | 9/2013 | Chang et al. | |
| 2014/0166961 A1 | 6/2014 | Liao et al. | |
| 2014/0203236 A1 | 7/2014 | Chen et al. | |
| 2014/0264222 A1 | 9/2014 | Yang et al. | |
| 2014/0264233 A1 | 9/2014 | Tu et al. | |
| 2015/0048297 A1 | 2/2015 | Hsieh et al. | |
| 2015/0085558 A1 | 3/2015 | Chang et al. | |
| 2015/0109849 A1 | 4/2015 | Tsai et al. | |
| 2015/0109850 A1 | 4/2015 | Chang et al. | |
| 2015/0170741 A1 | 6/2015 | Chih et al. | |

(Continued)

*Primary Examiner* — Harry W Byrne

(74) *Attorney, Agent, or Firm* — Duane Morris LLP (57) ABSTRACT

A bit-line of a resistive memory cell includes a reference branch including a reference resistor having a predetermined value and a cell branch including an adjustable memory resistor having a variable value. The reference branch generates a reference current based on the predetermined value of the reference resistor and the cell branch generates a cell branch current based on a selected value of the adjustable memory resistor. A sense amplifier has a first input coupled to the reference branch and a second input coupled to the cell branch. A first pre-charge transistor is coupled to a first pre-charge voltage and the cell branch. The first pre-charge transistor is configured to pre-charge the cell branch to the first pre-charge voltage prior to a read operation.

20 Claims, 6 Drawing Sheets

(56) References Cited

U.S. PATENT DOCUMENTS

2015/0269997 A1 9/2015 Lin et al.
2015/0380063 A1 12/2015 Chang et al.

* cited by examiner

FAST SENSE AMPLIFIER WITH BIT-LINE PRE-CHARGING

CROSS-REFERENCE TO RELATED APPLICATION

This application is a continuation of U.S. patent application Ser. No. 15/150,478, filed on May 10, 2016, and entitled "FAST SENSE AMPLIFIER WITH BIT-LINE CHARGING," the disclosure of which is incorporated herein in its entirety.

BACKGROUND

Current emerging memory read operations convert a resistance state stored in a bit-cell into one or more current signals on a cell current branch. A conventional current sense amplifier includes two-stage amplification. The first stage includes two branches, a reference branch and cell branch. The reference branch generates a reference current (Iref) and a reference voltage (Vref) input for a sense amplifier. The cell branch generates a cell current (Icell) and includes an adjustable resistor RRAM. The current difference between the cell current and the reference current generates a voltage signal (Vdi) second input of the sense amplifier. If Vdi is greater than Vref, a logic "1" is read during the read operation. If Vdi is less than Vref, a logic "0" is read during the read operation.

Because Vdi is pulled down from VDD to a final stabilized level for a logic "1", the conventional current sense amplifier requires a substantial (>10 nanoseconds) stabilization time to settle the current signal to a reference level. After the current signal is settled, the sense amplifier compares Vdi and Vref to generate a logic output. The stabilization time needed in conventional current sense amplifiers prevents read operations from being performed at high-speeds (such as <10 nanoseconds). Further, conventional current sense amplifiers produce a high spike current during a read operation.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In various embodiments, a memory cell including a pre-charged bit-line is disclosed. The bit-line includes a first pre-charge transistor and a second pre-charge transistor coupled to a read signal. Prior to performing a read operation, the cell branch bit-line is pre-charged by the first pre-charge transistor to a first pre-charge voltage VBL. The second pre-charge transistor provides a second pre-charge voltage VRBL to the cell branch of the memory cell to pre-charge the cell branch. The voltage at the cell branch input (Vdi) is pulled up or pulled down from the pre-charge voltage based on the resistive state of the cell branch. The sense amplifier generates an output based on the difference between the cell branch voltage Vdi and the reference voltage Vref. In some embodiments, the pre-charge voltage is equal to $VCL-V_{thn}$, where VCL is a clamping voltage and $V_{thn}$ is a threshold voltage of a clamping device.

Figure 1:
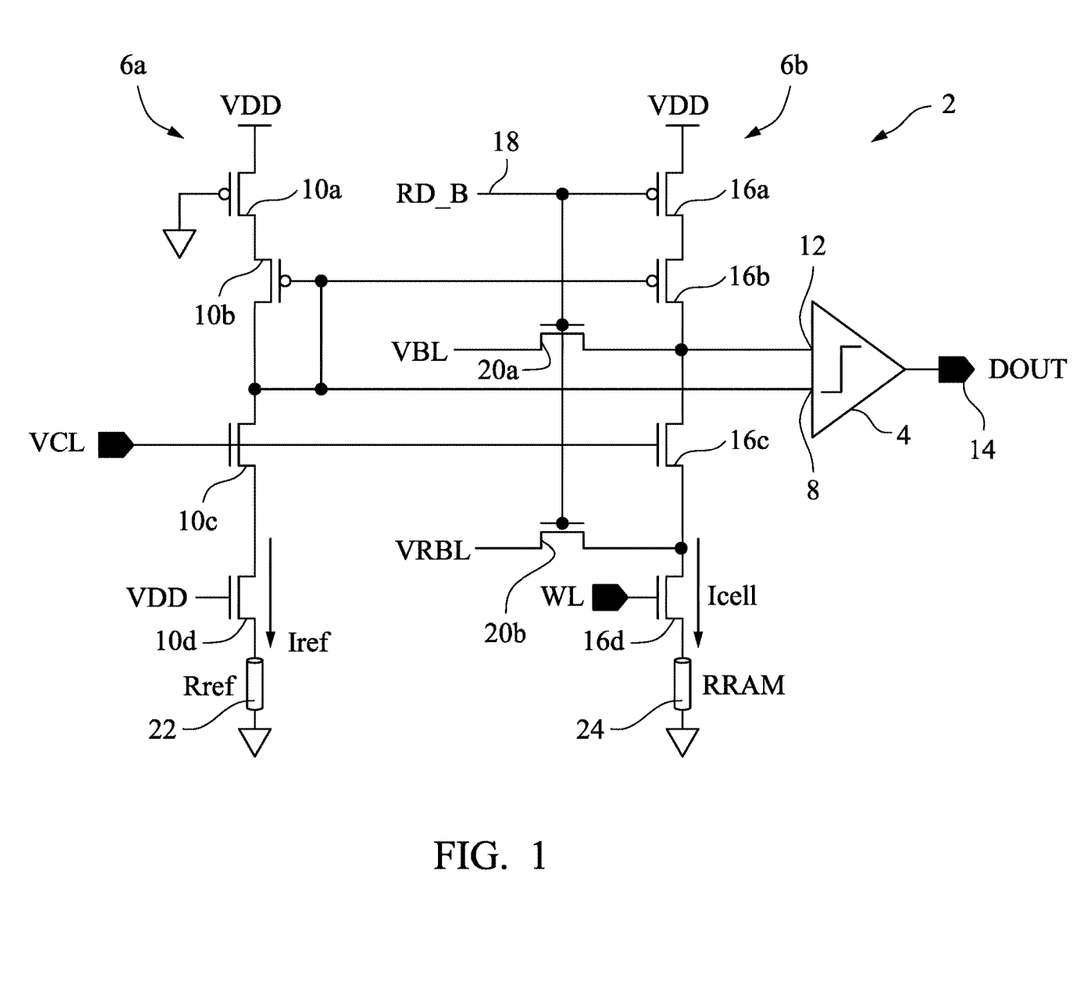
FIG. 1 illustrates an emerging memory cell having a pre-charged bit-line, in accordance with some embodiments.

FIG. 1 illustrates one embodiment of a resistive memory cell including a pre-charged bit-line 2. The bit-line 2 includes a reference branch 6a and a cell branch 6b. The reference branch 6a is configured to generate a reference voltage Vref at a first input 8 of the sense amplifier 4. The reference branch 6a includes a disconnect transistor 10a, a mirror transistor 10b, a control transistor 10c, and a current transistor 10d. In some embodiments, the disconnect transistor 10a includes a source coupled to a voltage supply VDD, a gate coupled to ground, and a drain coupled to the source of the mirror transistor 10b. The mirror transistor 10b can further include a gate coupled to a mirror transistor 16b of the cell branch 6b (as described in more detail below) and a drain coupled to the source of a control transistor 10c. The control transistor 10c can further include a gate coupled to a control voltage VCL and a drain coupled to a current transistor 10d. The current transistor 10d can further include a gate coupled to VDD and a drain coupled to a reference resistor Rref 22. When the memory cell 2 is accessed for a read operation, the reference branch 6a develops a predetermined reference current Iref based on the value of VDD and the resistive value of the memory resistor Rref 22. For example, in some embodiments, VDD is equal to 1.1 volts, although it will be appreciated that other values of VDD may be used.

In some embodiments, the cell branch 6b is configured to generate a cell voltage Vdi at a second input 12 of the sense amplifier 4. The voltage difference between the first input 8 (Vref) and the second input 12 (Vdi) determines the output 14 of the sense amplifier 4. For example, in some embodiments, if Vref is less than Vdi, a voltage value corresponding to a logic "1" is output and if Vref is greater than Vdi a voltage value corresponding to a logic "0" is output. In some embodiments, the cell branch 6b includes a disconnect transistor 16a, a mirror transistor 16b, a control transistor 16c, and a word-line transistor 16d. A gate of the disconnect transistor 16*a* is coupled to a read signal line (RD_B) 18, the source is coupled to VDD, and the drain is coupled to a source of a mirror transistor 16*b*. The gate of the mirror transistor 16*b* is coupled to the gate of the mirror transistor 10*b* of the reference branch 6*a* to form a current mirror. The drain of the mirror transistor 16*b* is coupled to the second input 12 of the sense amplifier and further coupled to the source of the control transistor 16*c*. The gate of the control transistor 16*c* is coupled to a control voltage VCL and the drain of the control transistor 16*c* is coupled to the source of the word-line transistor 16*d*. The gate of the word-line transistor 16*d* is coupled to a word-line for addressing the memory cell 2. The drain of the word-line transistor 16*d* is coupled to the RRAM resistor 24. The resistive value of the RRAM resistor 24 is adjusted by the memory cell based on the data state (e.g., logic "1" or logic "0") stored in the memory cell.

In some embodiments, the read signal (RD_B) 18 is also provided to a gate of a first pre-charge transistor 20*a*. The source of the first pre-charge transistor is coupled to a first pre-charge voltage VRBL. The first pre-charge transistor 20*b* pre-charges the cell branch 6*b* bit-line to at least a portion of the first pre-charge voltage VRBL when the first pre-charge transistor 20*b* is placed in an active and/or saturation mode by the read signal 18. A read operation pulls the cell branch 6*b* voltage up or down based on the resistive value of the RRAM resistor 24. The voltage VRBL pre-charges the cell branch 6*b* such that the cell branch 6*b* is not pulled up and/or pulled down from a voltage close to zero, but instead is pulled up/pulled down from a voltage equal to VRBL (or some portion thereof). Thus, the pre-charged cell branch 6*b* reduces the stabilization time required to stabilize the cell branch voltage (Vdi) at the second input 12, reducing read time for the bit-line 2 compared to conventional current sense amplifier memory cells In some embodiments, the read signal (RD_B) 18 is further provided to a gate of a second pre-charge transistor 20*b*. The source of the second pre-charge transistor 20*a* is coupled to a second pre-charge voltage VBL and the drain is coupled to the second input 12 of the sense amplifier 4. When the second pre-charge transistor 20*a* is placed in an active and/or saturation mode, for example when RD_B has a value of logic "0," the second input 14 of the sense amplifier 4 is pre-charged to at least a portion of the second pre-charge voltage VBL. The voltage VBL pre-charges the second input 12 such that the cell branch 6*b* does not have to pull up and/or pull down the voltage at the second input 12 from zero or VDD, but instead pulls up/pulls down the voltage from VBL. The pre-charged second input further reduces the stabilization time required to stabilize the cell branch voltage (Vdi) at the second input 12, reducing read time for the bit-line 2 compared to conventional current sense amplifier memory cells.

The cell branch 6*b* is normally disconnected from the voltage source VDD by disconnect transistor 16*a*. When a read operation is performed, the read signal (RD_B) 18 couples the cell branch 6*b* to the voltage source VDD by placing the disconnect transistor 16*a* in an active and/or saturation mode. Simultaneously, the read signal RD_B is provided to the gate of the first pre-charge transistor 20*b*, which transitions to an active and/or saturation mode and pre-charges the cell branch 6*b* to a predetermined level less than or equal to VBL (such as, for example, $VCL-V_{thn}$).

In some embodiments, simultaneously with the pre-charging of the cell branch 6*b*, the read signal (RD_B) 18 is provided to the gate of the first pre-charge transistor 20*b*, which transitions to an active and/or saturation mode and pre-charges cell branch 6*b* at a source of the word-line transistor 16*d* to a predetermined value less than or equal to VRBL.

Thus, the read signal (RD_B) 18 places the disconnect transistor 16*a* into an active and/or saturation mode, connecting the cell branch 6*b* to the voltage source VDD. The gate of the disconnect transistor 10*a* in the reference branch 6*a* is coupled to ground and maintained in saturation mode, coupling the reference branch 6*a* to the voltage source VDD. A reference current Iref is developed on the reference branch 6*a* and is mirrored to the cell branch 6*b* by the mirror transistors 10*b*, 16*b*. The cell branch current Icell is determined by the resistive value of the RRAM resistor 24. The voltage Vdi is pulled up or pulled down based on the value of Icell. Because the second input 12 (Vdi) is pre-charged by the first pre-charge transistor 20*a*, the branch voltage is generated by pulling Vdi up from and/or down from the first pre-charge voltage VBL. The difference between the reference voltage Vref and Vdi is detected by the sense amplifier 4 and a logic value is generated at the output 14 based on the difference in values. For example, in some embodiments, if Vdi is greater than Vref, the sense amplifier 4 generates a voltage corresponding to a logic "0" and if Vdi is less than Vref, the sense amplifier generates a voltage corresponding to a logic "1".

Figure 2:
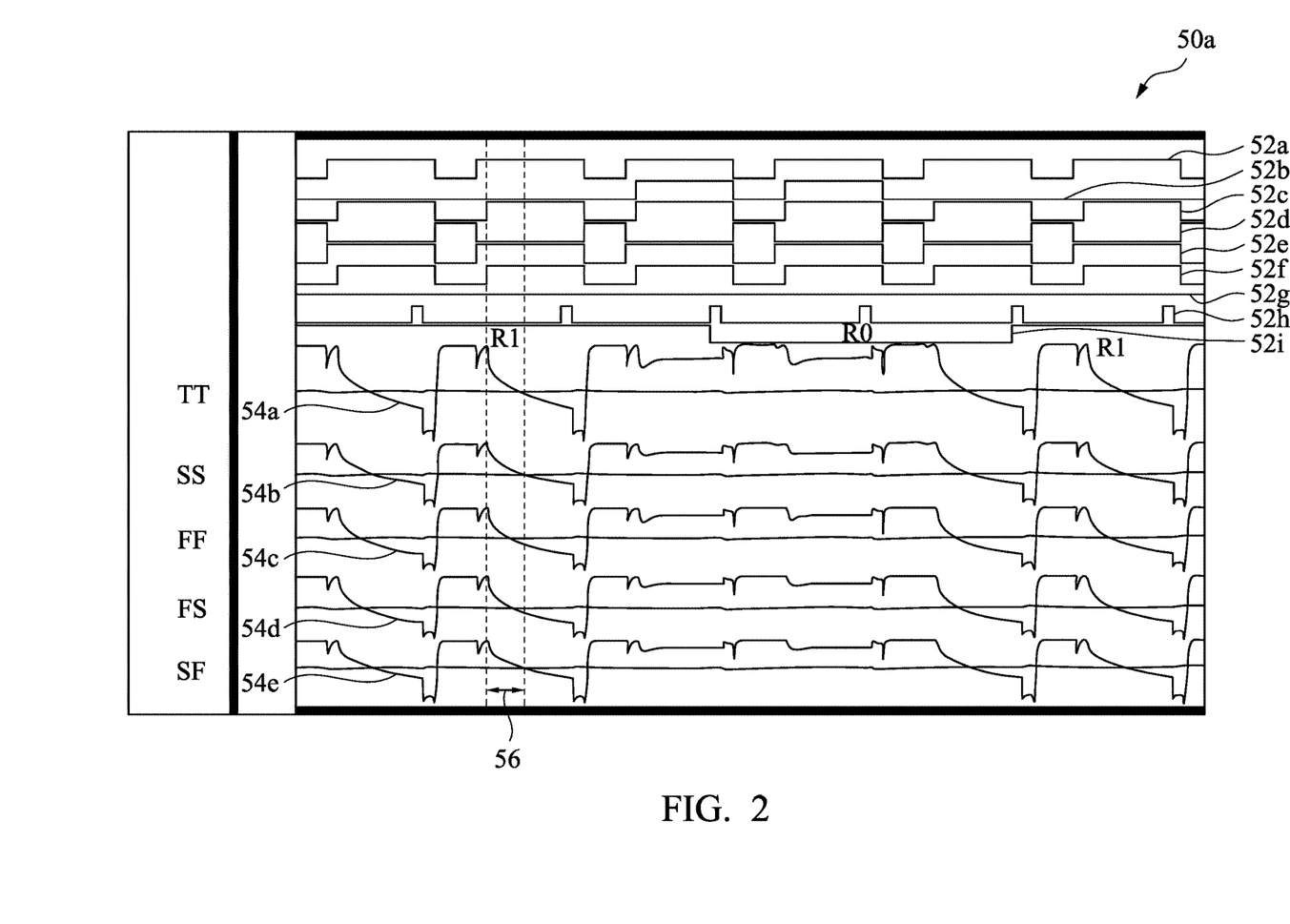
FIG. 2 is a chart illustrating the read performance of a conventional current sense bit-line.
Figure 3:
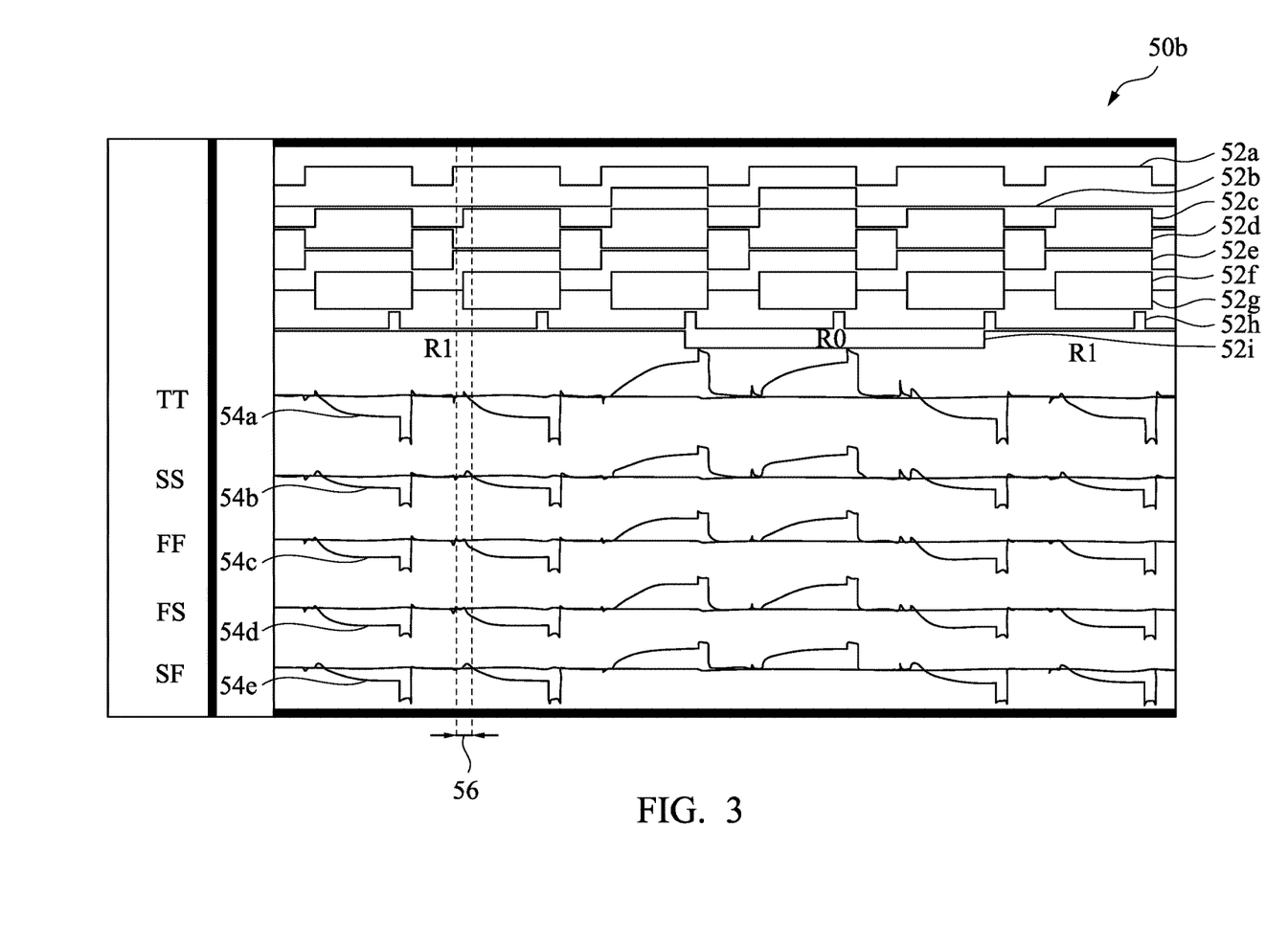
FIG. 3 is a chart illustrating the read performance of the bit-line illustrated in FIG. 1.

FIG. 2 is a chart 50*a* illustrating a conventional resistive cell response and FIG. 3 is a chart 50*b* illustrating response times for the bit-line 2 with pre-charging illustrated in FIG. 1 FIG. 2 and FIG. 3 each illustrate a plurality of simulated digital signals 52*a*-52*i* corresponding to digital signals received during operation of a resistive memory cell. For example, the simulated digital signals include a first read signal RD 52*a* (discussed in more detail below with respect to FIGS. 4 and 5), a first word-line voltage 52*b*, a second word-line voltage 52*c*, bit array signals 52*d*, 52*e*, a redundant bit-line signal BL_RD 52*f*, a second read signal RD_B 52*g*, a read clock signal 52*h*, and a resistor voltage signal 52*i* corresponding to a resistive value of the RRAM resistor 24.

FIG. 2 and FIG. 3 each further illustrate process corner case responses 54*a*-54*e* for an RRAM memory chip without pre-charging (FIG. 2) and with pre-charging (FIG. 3), based on the digital input signals 52*a*-52*i*. FIG. 2 and FIG. 3 illustrate five process corner case responses: a typical-typical corner 54*a*, a slow-slow corner (54*b*), a fast-fast corner (54*c*), a fast-slow corner (54*d*), and a slow-fast corner (54*e*). Each of the corners 54*a*-54*e* correspond to one or more process variations during semiconductor fabrication. As shown in FIG. 2, a response time 56 (e.g., stabilization time during a pull-down and/or pull-up operation) of the non-pre-charged memory cell is at least 16 ns for each of the corner cases 54*a*-54*e*. In contrast, as shown in FIG. 3, the response time 56 of the pre-charged memory cell 2 illustrated in FIG. 1 is less than 10 ns for each corner case 54*a*-54*e*. Thus, the shorter response time 56 provides shorter stabilization (less than 10 ns), allowing read operations faster than conventional resistive memory cell, which typically requires at least 16 ns per read for stabilization.

Figure 4:
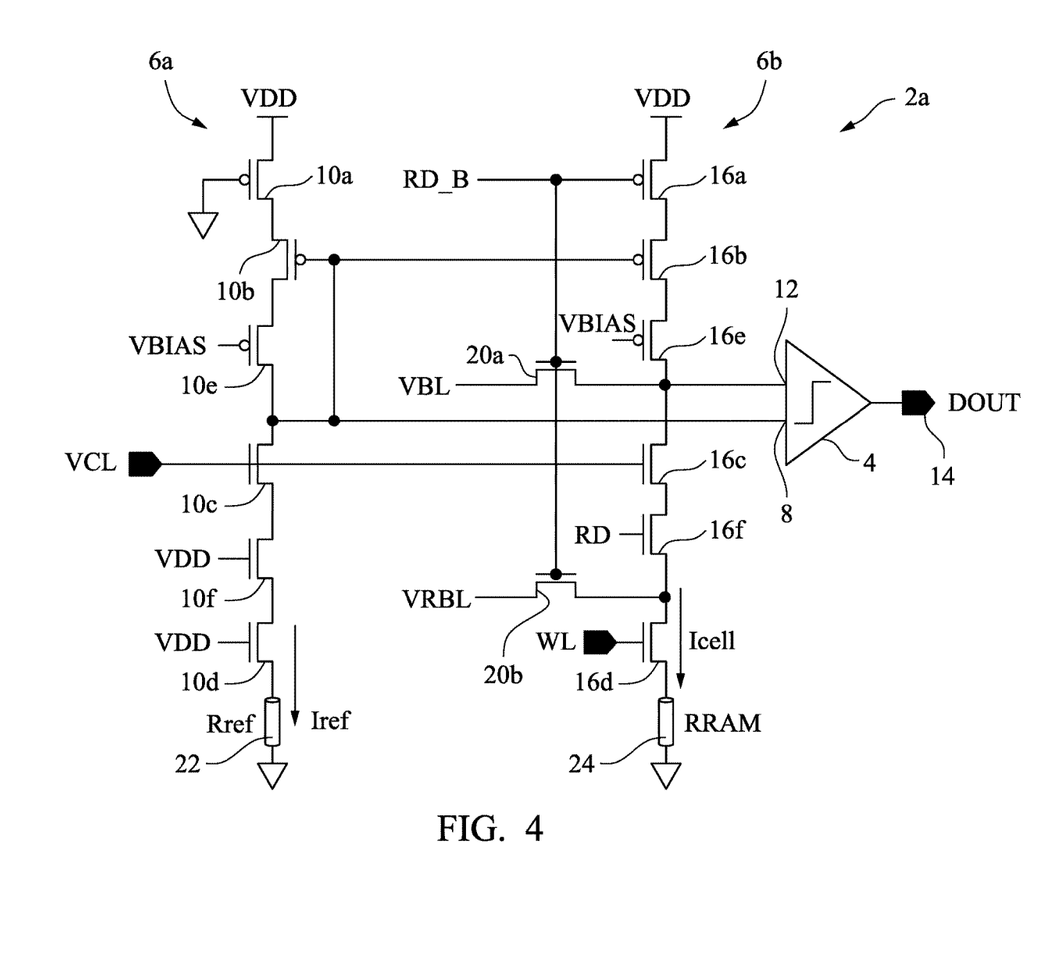
FIG. 4 illustrates an emerging memory cell having a cascode pre-charged bit-line, in accordance with some embodiments.

FIG. 4 illustrates an emerging memory cell having a cascode pre-charged bit-line, in accordance with some embodiments. The cascode memory cell 2*a* includes a reference branch 6*a* and a cell branch 6*b*. The cascode memory cell 2*a* is similar to the memory cell 2 described with respect to FIG. 1 and a description of the same or similar components or features is not repeated here. The cascode memory cell 2*a* further includes cascode transistors 10*e*, 16*e*. Each of the cascode transistors 10*e*, 16*e* are coupled to a biasing voltage at a gate. The source of the cascode transistor 10e in the reference branch 6a is coupled to the drain of a mirror transistor 10b and the source of the cascode transistor 16e in the cell branch 6b is coupled to the drain of the mirror transistor 16b. The drain of the cascode transistor 10e in the reference branch 6a is coupled to the source of the control transistor 10c and the drain of the cascode transistor 16e in the cell branch 6b is coupled to the source of the control transistor 16c. The biasing voltage VBIAS is selected to provide a predetermined source-emitter voltage over the cascode transistor 10e, 16e such that the cascode transistor 10e, 16e reduces the Miller feedback capacitance of the control transistors 10c, 16c and/or the sense amplifier 4. The cascode transistor provides a higher input impedance based on the selection of VBIAS, which increases the output impedance, Rout, of the bit-line 2.

In some embodiments, the cascode bit-line 2a includes second read transistors 10f, 16f. The second read transistor 10f of the reference branch 6a has a gate coupled to the voltage source VDD, a source coupled to the drain of the control transistor 10c, and a drain coupled to the source of the current transistor 10d. The second read transistor 16f of the cell branch 6b includes a gate coupled to a second read signal RD 26, a source coupled to the drain of the control transistor 16c, and a drain coupled to the source of the word-line transistor 16d. The second read signal RD 26 can be a redundant read signal, a complimentary read signal, and/or an additional read signal with respect to the read signal RD_B 18 discussed above. For example, in some embodiments, the second read signal RD 26 is a complimentary read signal with respect to the first read signal RD_B 18. A read operation is performed on the bit-line only when the first read signal RD_B 18 has a complimentary (e.g., opposite) value of the second read signal 26.

Figure 5:
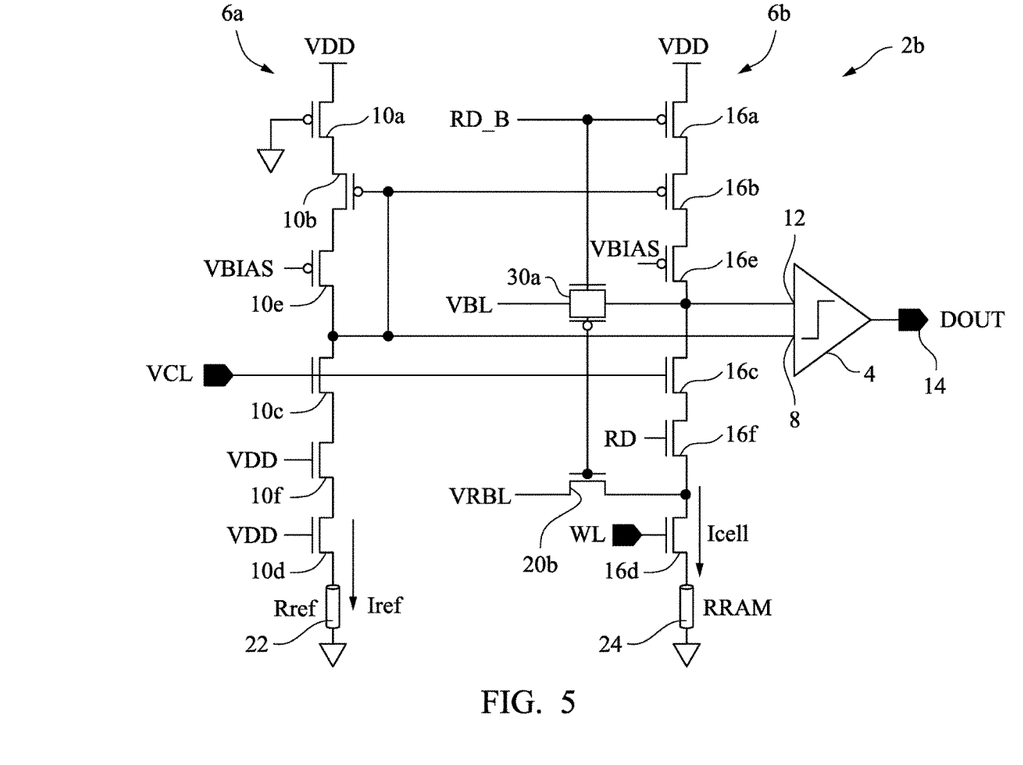
FIG. 5 illustrates emerging memory cell having a complimentary pass-gate as a pre-charger for pre-charging a bit-line, in accordance with some embodiments.

FIG. 5 illustrates one embodiment of a memory cell bit-line 2b including complementary pass-gate 30a as a sense amplifier 4 pre-charger. The memory cell bit-line 2b is similar to the cascode memory cell bit-line 2b illustrated in FIG. 4, and descriptions of the same or similar components or features is not repeated here. The memory cell bit-line 2b replaces at least one of the pre-charging transistors 20a with a pre-charging pass-gate 30a. The pass-gate 30a can comprise any suitable pass-gate, such as, for example, a CMOS pass gate 30a as illustrated in FIG. 5. The pass-gate 30a functions similarly to the second pre-charge transistor 20a but provides faster pull-up time for pre-charging Vdi to the pre-charge voltage VBL and a slower pull-down response than the second pre-charge transistor 20a.

Figure 6:
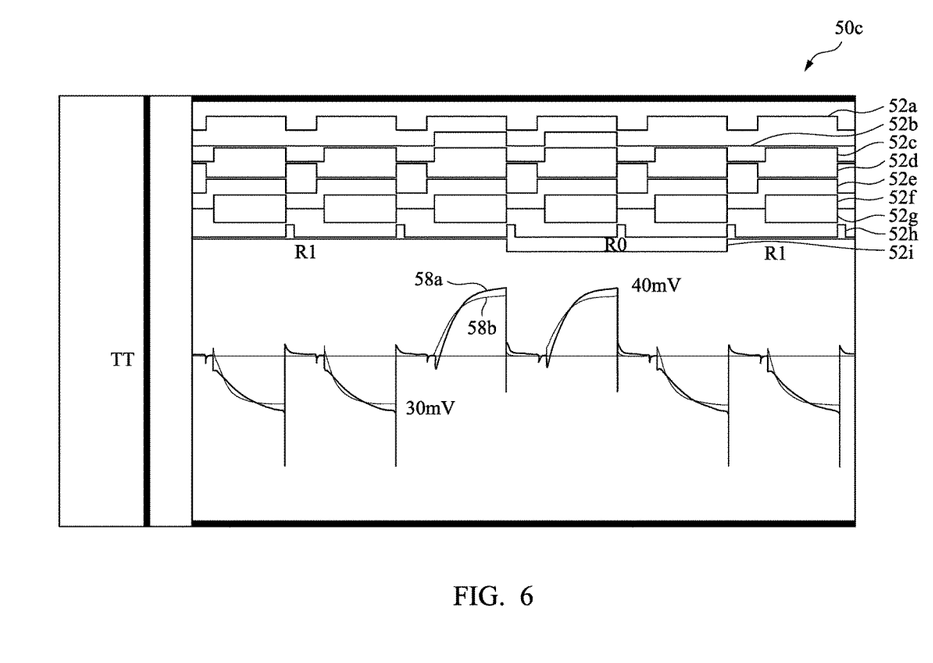
FIG. 6 is a chart illustrating response times for pre-charged memory cells having different Rout schemes, in accordance with some embodiments.

FIG. 6 is a chart illustrating response times for pre-charged memory cells having different Rout schemes. FIG. 6 illustrates the same plurality of simulated digital signals 52a-52i corresponding to digital signals received during operation of a resistive memory cell as illustrated in FIGS. 2 and 3, and similar description is not repeated herein. FIG. 6 further illustrates the typical-typical (TT) response times for a pre-charged resistive memory cell 58a and a pre-charged cascode resistive memory cell 58b. As can be seen in FIG. 6, however, the cascode memory cell response 58b provides a lower peak voltage than the pre-charged resistive memory cell response 58a, corresponding to a higher impedance and higher output resistance generated by the cascode transistor 10e in the cascode memory cell.

Although specific embodiments have been discussed herein having specific transistor arrangements (e.g., gate-source-drain connections), it will be appreciated by those skilled in the art that the various circuits disclosed and discussed herein can be implemented using a variety of transistors (e.g., PMOS, NMOS, CMOS) each having a variety of arrangements (e.g., gate-source-drain connections), such as, for example, replacing one or more NMOS transistors with one or more PMOS transistors, in any of the illustrated circuits.

In various embodiments, a bit-line of a resistive memory cell includes a reference branch including a reference resistor having a predetermined value and a cell branch including an adjustable memory resistor having a variable value. The reference branch generates a reference current based on the predetermined value of the reference resistor and the cell branch generates a cell branch current based on a selected value of the adjustable memory resistor. A sense amplifier has a first input coupled to the reference branch and a second input coupled to the cell branch. A first pre-charge transistor is coupled to a first pre-charge voltage and cell branch. The first pre-charge transistor is configured to pre-charge the cell branch to the first pre-charge voltage prior to a read operation.

In various embodiments, a bit-line of a resistive memory cell includes a reference branch including a reference resistor having a predetermined value and a cell branch including an adjustable memory resistor having a variable value. The reference branch generates a reference current based on the predetermined value of the reference resistor and the cell branch generates a cell branch current based on a selected value of the adjustable memory resistor. A sense amplifier has a first input coupled to the reference branch and a second input coupled to the cell branch. A pre-charge transistor is coupled to a pre-charge voltage and the cell branch. The pre-charge transistor is configured to pre-charge the cell branch to the pre-charge voltage prior to a read operation, where the first-pre charge voltage is equal to $VCL-V_{thn}$, where VCL is a clamping voltage of a clamping device of the cell branch and $V_{thn}$ is a threshold voltage of the clamping device.

In various embodiments, a bit-line of a resistive memory cell includes a reference branch including a reference resistor having a predetermined value and a cell branch including an adjustable memory resistor having a variable value. The reference branch generates a reference current based on the predetermined value of the reference resistor and the cell branch generates a cell branch current based on a selected value of the adjustable memory resistor. A sense amplifier has a first input coupled to the reference branch and a second input coupled to the cell branch. A first pre-charge transistor is coupled to a first pre-charge voltage and the cell branch. The first pre-charge transistor is configured to pre-charge the cell branch to the first pre-charge voltage prior to a read operation. A second pre-charge transistor is coupled to a second pre-charge voltage and the second input of the sense amplifier. The second pre-charge transistor is configured to pre-charge the second input of the sense amplifier to the second pre-charge voltage prior to a read operation. A gate of each of the first pre-charge transistor and the second pre-charge transistor are coupled to a read signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive memory cell bit-line, comprising:
   a cell branch including an adjustable memory resistor having a variable value, wherein the cell branch generates a cell branch current based on a selected value of the adjustable memory resistor; and
   a first pre-charge transistor configured to pre-charge the cell-branch to a first pre-charge voltage.

2. The resistive memory cell bit-line of claim 1, comprising a reference branch including a reference resistor having a predetermined value, wherein the reference branch generates a reference current based on the predetermined value of the reference resistor.

3. The resistive memory cell bit-line of claim 1, wherein the first pre-charge transistor is coupled between a first voltage source and the cell-branch.

4. The resistive memory cell bit-line of claim 3, wherein the first voltage source has a voltage equal to the first pre-charge voltage.

5. The resistive memory cell bit-line of claim 1, wherein a gate of the first pre-charge transistor is coupled to a read control signal.

6. The resistive memory cell bit-line of claim 1, comprising a sense amplifier having a first input coupled to the cell branch.

7. The resistive memory cell bit-line of claim 6, comprising a second pre-charge transistor coupled to the sense amplifier, wherein the second pre-charge transistor is configured to pre-charge the sense amplifier to a second pre-charge voltage.

8. The resistive memory cell bit-line of claim 1, wherein the cell branch includes at least one cascode transistor.

9. The resistive memory cell bit-line of claim 8, wherein the at least one cascode transistor includes at least one transistor having a gate coupled to a biasing voltage.

10. The resistive memory cell bit-line of claim 8, wherein the at least one cascode transistor in the cell branch includes at least one transistor having a gate coupled to a read bit signal.

11. The resistive memory cell bit-line of claim 1, wherein the first-pre charge voltage is equal to VCL-$V_{thn}$, where VCL is a clamping voltage of a clamping device of the cell branch and $V_{thn}$ is a threshold voltage of the clamping device.

12. A resistive memory cell bit-line, comprising:
    a cell branch including an adjustable memory resistor having a variable value, wherein the cell branch generates a cell branch current based on a selected value of the adjustable memory resistor; and
    a pre-charge transistor coupled to a pre-charge voltage and the cell branch, wherein the pre-charge transistor is configured to pre-charge the cell branch to the pre-charge voltage prior to a read operation, wherein the first-pre charge voltage is equal to VCL-$V_{thn}$, VCL is a clamping voltage of a clamping device of the cell branch and $V_{thn}$ is a threshold voltage of the clamping device.

13. The resistive memory cell bit-line of claim 10, comprising a reference branch including a reference resistor having a predetermined value, wherein the reference branch generates a reference current based on the predetermined value of the reference resistor.

14. The resistive memory cell bit-line of claim 12, wherein a gate of the pre-charge transistor is coupled to a read control signal.

15. The resistive memory cell bit-line of claim 10, wherein the cell branch include at least one cascode transistor.

16. A resistive memory cell, comprising:
    a cell branch including an adjustable memory resistor having a variable value, wherein the cell branch generates a cell branch current based on a selected value of the adjustable memory resistor;
    a sense amplifier having a first input coupled to the cell branch;
    a first pre-charge transistor coupled to a first pre-charge voltage and the cell branch, wherein the first pre-charge transistor is configured to pre-charge the cell branch to the first pre-charge voltage prior to a read operation; and
    a second pre-charge transistor coupled to the sense amplifier, wherein the second pre-charge transistor is configured to pre-charge an input of the sense amplifier to a second pre-charge voltage prior to a read operation.

17. The resistive memory cell of claim 13, wherein the cell branch includes at least one cascode transistor.

18. The resistive memory cell of claim 17, wherein the at least one cascode transistor includes at least one transistor having a gate coupled to a biasing voltage.

19. The resistive memory cell of claim 17, wherein the at least one cascode transistor in the cell branch includes at least one transistor having a gate coupled to a read bit signal.

20. The resistive memory cell of claim 13, wherein the cell branch comprises a word-line transistor having a gate coupled to a word-line.

* * * * *